United States Patent
Choi et al.

(10) Patent No.: US 6,899,760 B2
(45) Date of Patent: May 31, 2005

(54) SILICON SINGLE CRYSTAL GROWING FURNACE SUPPLEMENTED WITH LOW MELTING POINT DOPANT FEEDING INSTRUMENT AND THE LOW MELTING POINT DOPANT FEEDING METHOD THEREOF

(75) Inventors: Ill Soo Choi, Gumi (KR); Hyun Kyo Choi, Gumi (KR)

(73) Assignee: Siltron, Inc., Gumi (KR)

( * ) Notice: Subject to any disclaimer, the term of this patent is extended or adjusted under 35 U.S.C. 154(b) by 53 days.

(21) Appl. No.: 10/318,099

(22) Filed: Dec. 13, 2002

(65) Prior Publication Data

US 2004/0069214 A1 Apr. 15, 2004

(30) Foreign Application Priority Data

Oct. 15, 2002 (KR) ................................. 10-2002-0062902

(51) Int. Cl.[7] .............................................. C30B 15/20
(52) U.S. Cl. ...................... 117/19; 117/213; 117/214; 117/216; 117/217; 117/218
(58) Field of Search ........................ 117/19, 213, 214, 117/216, 217, 218

(56) References Cited

U.S. PATENT DOCUMENTS

| | | |
|---|---|---|
| 5,976,245 A | 11/1999 | Aydelott |
| 6,019,838 A | 2/2000 | Canella |
| 6,284,041 B1 | 9/2001 | Hamada et al. |
| 6,312,517 B1 | 11/2001 | Banan et al. |

FOREIGN PATENT DOCUMENTS

| | | | |
|---|---|---|---|
| EP | 0635588 A1 | 1/1995 | ........... C30B/15/04 |
| JP | 8-239291 | 9/1996 | ......... H01L/21/208 |
| KR | 2003-0015239 | 2/2003 | ........... C30B/15/04 |

*Primary Examiner*—Felisa Hiteshew
(74) *Attorney, Agent, or Firm*—Mayer, Brown, Rowe & Maw LLP

(57) ABSTRACT

A silicon single crystal growing apparatus supplemented with a low melting point dopant feeding instrument and a low melting point dopant feeding method thereof for producing a heavily doped silicon single crystal with a dopant of low melting point. The apparatus includes a quartz crucible containing molten silicon liquid, a heating unit supplying the quartz crucible with a radiant heat, a crystal pulling lifter pulling up a silicon single crystal from a molten silicon liquid contained in the quartz crucible, and a low melting point dopant feeding instrument. The low melting point dopant feeding instrument includes a sidewall portion, an upper portion, and an open bottom portion with net-like structure having many holes, the sidewall and upper portions being vacuum-tight sealed. The method includes the steps of loading a low melting point dopant inside a low melting point dopant feeding instrument having vacuum-tight sealed sidewall and upper portions and an open bottom portion with net-like structure having many holes, and dipping the bottom portion of the low melting point dopant feeding instrument in a molten silicon liquid contained inside a quartz crucible. The low melting point dopant is directly dissolved in the molten silicon liquid or evaporated and then finally dissolved in the form of a gas phase into the molten silicon liquid through the open holes of the bottom portion of the melting point dopant feeding instrument.

9 Claims, 5 Drawing Sheets

SILICON SINGLE CRYSTAL GROWING FURNACE SUPPLEMENTED WITH LOW MELTING POINT DOPANT FEEDING INSTRUMENT AND THE LOW MELTING POINT DOPANT FEEDING METHOD THEREOF

BACKGROUND OF THE INVENTION

1. Field of the Invention

The present invention relates to an apparatus for manufacturing silicon single crystals by the Czochralski (Cz) method and a dopant feeding method thereof and, more particularly, to a silicon single crystal growing furnace supplemented with a low melting point dopant feeding instrument and a low melting point dopant feeding method thereof for manufacturing a heavily doped silicon single crystal with a dopant of low melting point.

2. Background of the Related Art

Cz-grown silicon wafers are deliberately doped with a P or N type dopant during the crystal growing process to obtain a customized specific resistivity suitable for an individual semiconductor device fabrication.

Boron (B) is commonly used as a P-type dopant, and its melting point is about 2,180° C. higher than the melting point (about 1,412° C.) of silicon. When a boron-doped silicon single crystal is grown by the Czochralski (CZ) method, to add the dopant a molten silicon liquid the calculated amount of boron is simply located on the bottom of a quartz crucible together with poly-crystalline silicon during a stacking step in the crystal growth process. Any dopant having a melting point greater than 1412° C., such as boron, is called a high melting point dopant in the field of silicon single crystal growth industry, whereas any dopant having a melting point lower than 1,412° C. is called a low melting point dopant such as, for example, Sb (631° C.), red phosphorous (593° C.), As (817° C.), or the like.

When a low melting point dopant such as Sb, P needs to be heavily doped, the above-mentioned doping method is not practical since before polycrystalline silicon has been fully melted during the melting step, the low melting point dopant is melted and evaporated due to its melting point being lower than 1412° C. Thus, the evaporated low melting point dopant is exhausted out of the silicon crystal growing apparatus together with inert gas (e.g. Ar etc.) which is flowing inside the apparatus in order to remove silicon oxide evaporated from the molten silicon liquid. Hence, it is impossible to produce silicon single crystals having a desired low specific resistivity due to the loss of the dopant. If the apparatus is capsuled to prevent the evaporated low melting point dopant from being exhausted out of the furnace, the generation of oxide particles is enhanced. These particles act as heterogeneous nucleation sites and often prevent effective production of a silicon single crystal. In addition, silicon oxide ($SiO_x$) evaporated from molten silicon liquid remains in the furnace and contaminates the molten silicon and the inside of the apparatus, degrading the quality of crystal.

In the previous art, the low melting point dopant is directly added by dispersing the dopant on the surface of a molten silicon liquid through a feed hopper located a few feet from the molten silicon liquid after poly-crystalline silicon has been completely melted. In this case, the dopant falls to be completely dissolved in the molten silicon liquid because about 30% of the dopant evaporates to be exhausted out of the apparatus together with inert gas. Hence, it is impossible to accurately control dopant concentration in the molten silicon liquid. In addition, the generation of oxide particles is enhanced due to impurities existing in the metallurgical dopant of low degree of purity. As a consequence, a great deal of oxides float on the surface of the molten silicon liquid and act as a source of particles hit, thereby resulting in the failure to grow a silicon single crystal.

SUMMARY OF THE INVENTION

The present invention is directed to a silicon single crystal growing apparatus supplemented with a low melting point dopant feeding instrument and a low melting point dopant feeding method thereof in order to substantially obviate one or more of the problems due to limitations and disadvantages of the related art.

The object of the present invention is to provide a silicon single crystal growing apparatus supplemented with a low melting point dopant feeding instrument and a low melting point dopant feeding method thereof in order to accurately control the low melting point dopant concentration in the molten silicon liquid, to minimize the loss of the low melting point dopant due to the evaporation of the low melting point dopant, to prevent contamination of the molten silicon liquid, and to eliminate failure in silicon single crystal growth caused by oxides generated due to impurities existing in the metallurgical dopant of low degree of purity during the doping process.

Additional features and advantages of the invention will be set forth in the description which follows, and in part will be apparent from the description, or may be learned by practice of the invention. The objectives and further advantages of the invention will be realized and attained by the structure particularly pointed out in the written description and claims hereof as well as the appended drawings.

To achieve these advantages, and in accordance with the purpose of the present invention as embodied and broadly described herein, a silicon single crystal growing apparatus according to the present invention includes a quartz crucible containing a molten silicon liquid therein, a heating unit supplying the molten silicon liquid contained in the quartz crucible with radiant heat, a crystal pulling lifter pulling up a silicon single crystal from the molten silicon liquid, and a low melting point dopant feeding instrument. The low melting point dopant feeding instrument includes a vacuum-tight sealed sidewall portion and upper portion, and a net-like bottom with holes, wherein a low melting point dopant is loaded on the bottom of the feeding instrument.

Preferably, the low melting point dopant feeding instrument is made of high-purity fused quartz glass.

Preferably, a silicon wafer is inserted between the bottom of the low melting point dopant feeding instrument and the low melting point dopant before the low melting point dopant is loaded inside the low melting point dopant feeding instrument.

Preferably, the low melting point dopant feeding instrument further includes a conjunction part which is designed to be coupled with the seed chuck of a crystal pulling lifter wherein the coupling portion of the low melting point dopant feeding instrument is coupled with or separated from the seed chuck.

Preferably, the silicon single crystal growing apparatus further comprises a heat shield to cut off the radiant heat emitted from a heating unit or the surface of the molten silicon liquid from the low melting point dopant inside the low melting point dopant feeding instrument when the low melting point dopant feeding instrument is lowered and dipped into the molten silicon liquid contained in the quartz crucible.

Preferably, the silicon single crystal growing apparatus further includes a cooling device to cut off the radiant heat emitted from the heating unit or a molten silicon liquid from the dopant inside the low melting point dopant feeding instrument when the low melting point dopant feeding instrument is lowered and dipped into the molten silicon liquid contained in the quartz crucible.

In another aspect of the present invention, the low melting point dopant feeding method includes the steps of loading a low melting point dopant inside a low melting point dopant feeding instrument having vacuum-tight-sealed sidewall and upper portions and a net-like bottom with holes, and dipping the bottom portion of the low melting point dopant feeding instrument into the molten silicon liquid contained inside a quartz crucible, wherein the low melting point dopant is dissolved in the molten silicon liquid through the net-like bottom of the low melting point dopant feeding instrument.

Preferably, a silicon wafer is inserted between the bottom of the low melting point dopant feeding instrument and the low melting point dopant when the low melting point dopant is loaded inside the low melting point dopant feeding instrument.

Preferably, after loading the low melting point dopant inside the low melting point dopant feeding instrument, the method further includes the steps of coupling the low melting point dopant feeding instrument with the seed chuck of a crystal pulling lifter, lowering the crystal pulling lifter to dip the bottom portion of the low melting point dopant feeding instrument into the molten silicon liquid so that the low melting point dopant is dissolved and doped in the molten silicon liquid, and lifting the crystal pulling lifter to separate the low melting point dopant feeding instrument from the seed chuck after the molten silicon liquid is completely doped with the low melting point dopant.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and serve to explain the principles of the invention together with the description.

In the drawings.

DETAILED DESCRIPTION OF THE PREFERRED EMBODIMENTS

Figure 1A:
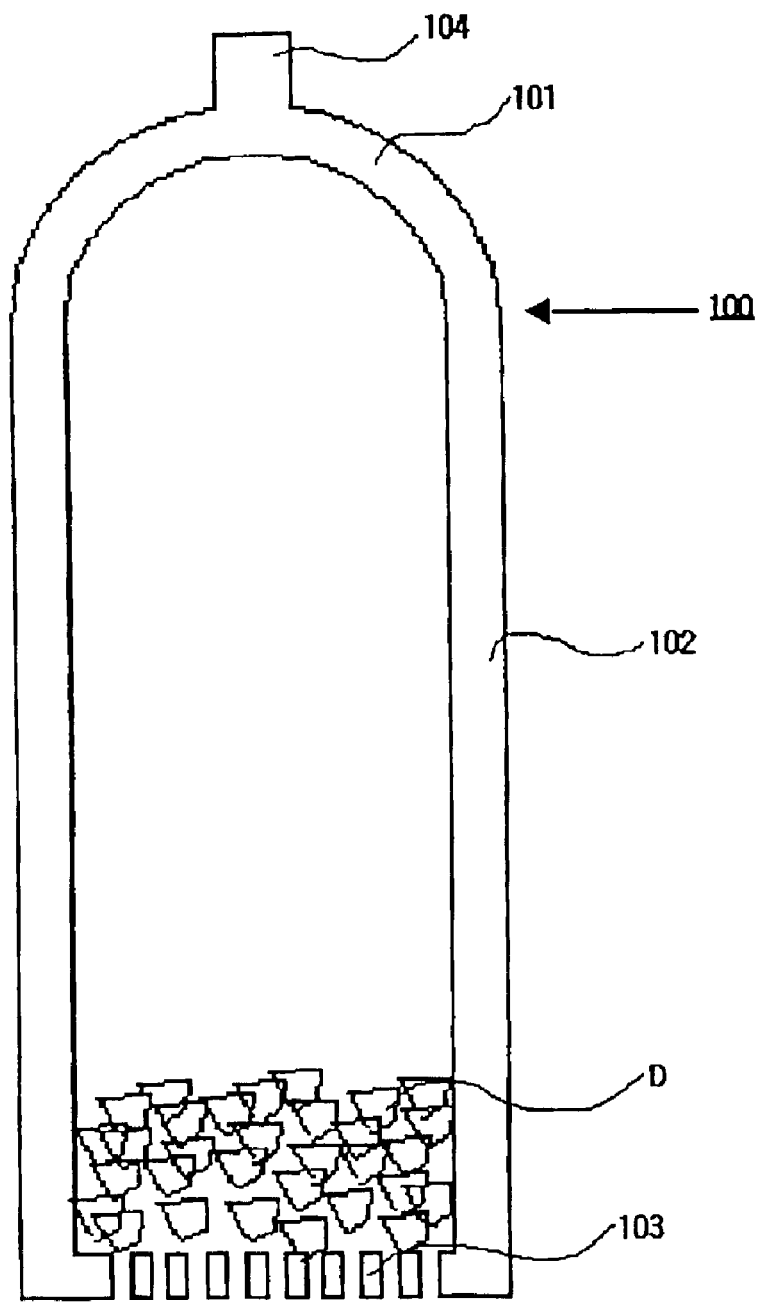
FIG. 1A is a cross-sectional view of a low melting point dopant feeding instrument according to the present invention.

Reference will now be made in detail to the preferred embodiments of the present invention, examples of which are illustrated in the accompanying drawings. Where possible, the same reference numerals will be used to indicate the same elements throughout the specification.

Figure 1B:
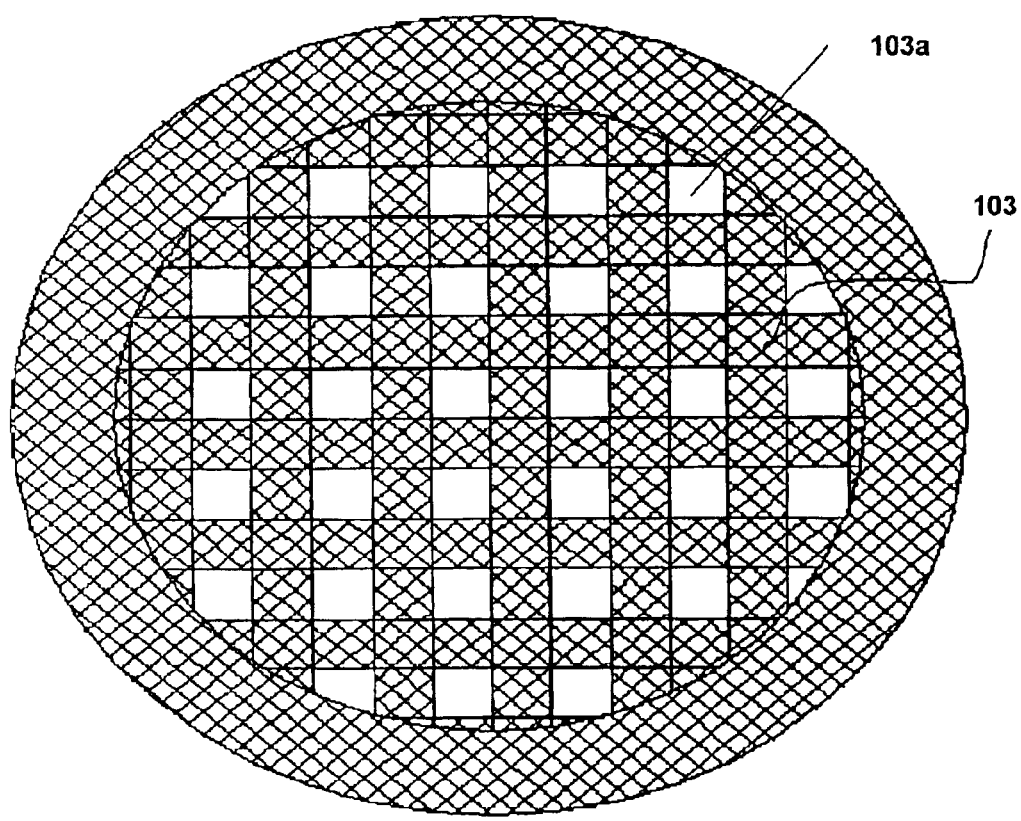
FIG. 1B is a bottom view of the low melting point dopant feeding instrument of FIG. 1A.
Figure 2:
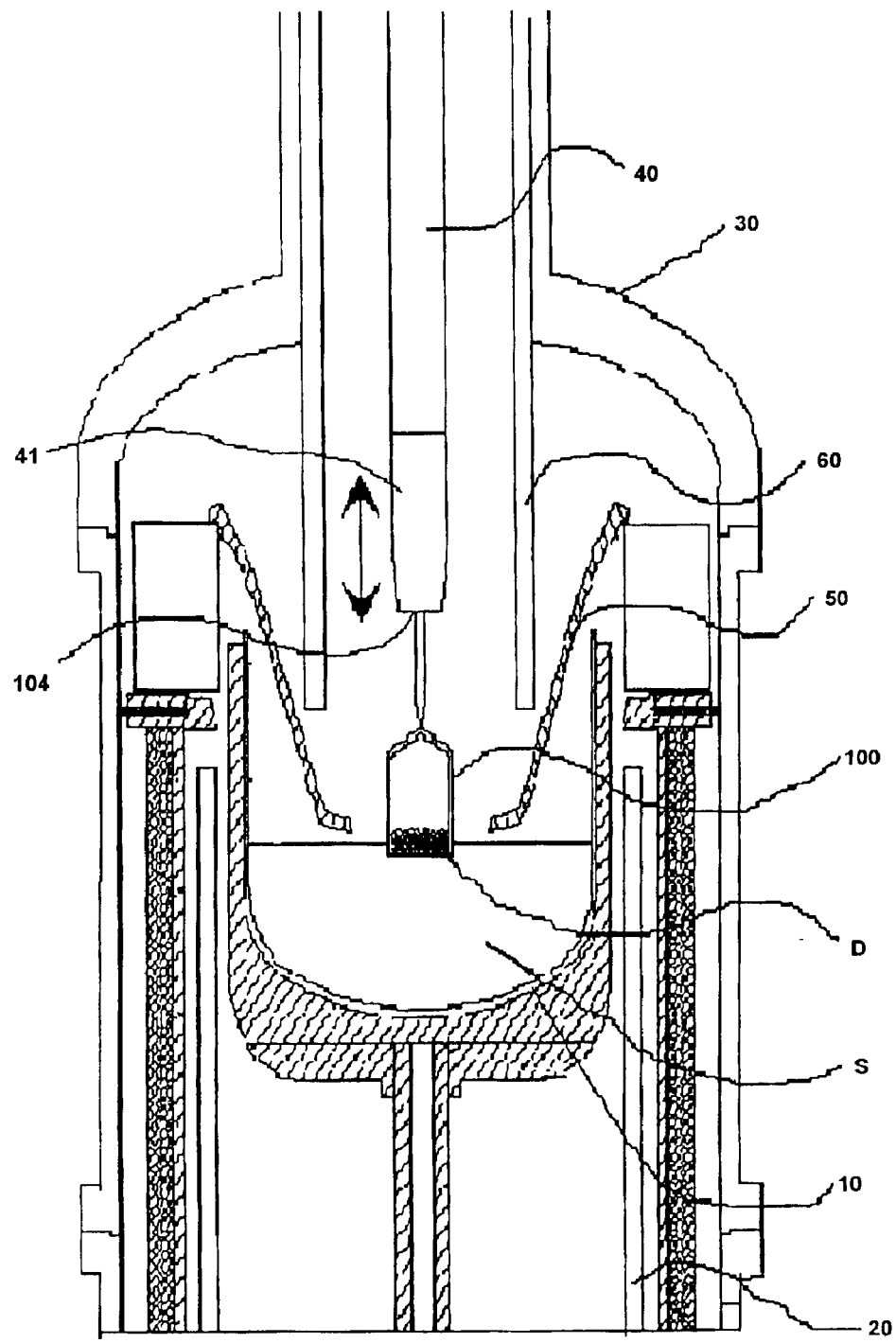
FIG. 2 is a schematic cross-sectional view of a silicon single crystal growing apparatus having a low melting point dopant feeding instrument according to the present invention.

A silicon single crystal growing apparatus supplemented with a low melting point dopant feeding instrument, as shown in FIG. 2, includes a quartz crucible 10 containing a molten silicon liquid, a heating unit 20 supplying the quartz crucible 10 with a radiant heat, a crystal pulling lifter 40 pulling up a silicon single crystal from the molten silicon liquid contained in the quartz crucible, and a low melting point dopant feeding instrument 100. The low melting point dopant feeding instrument 100, as shown in FIG. 1A and FIG. 1B, includes a sidewall portion 102, an upper portion 101, and a net-like bottom portion 103 with holes 103a therein, wherein the sidewall and upper portions 102 and 101 are vacuum-tight sealed. A low melting point dopant D is loaded inside the low melting point dopant feeding instrument 100.

The low melting point dopant D, such as Sb (631° C.), red phosphorous (593° C.), Ge (937° C.), As (817° C.), or the like, as shown in FIG. 1A, is loaded inside the low melting point dopant feeding instrument 100. The bottom 103 of the feeding instrument 100 having net-like structure with many holes 103a is dipped into the molten silicon liquid S, as shown in FIG. 1D. Since the melting point of the low melting point dopant D is considerably lower than that of silicon, some of the low melting point dopant D is directly melted and dissolved in the molten silicon liquid S, and the rest of the low melting point dopant is evaporated and finally dissolved in the molten silicon liquid in the form of a gas phase through the holes of the net-like bottom 103. In this case, since the upper and sidewall portions 101 and 102 of the low melting point dopant feeding instrument 100 are vacuum-tight scaled, the evaporated low melting point dopant is restricted inside the feeding instrument in the gas phase form and, such gas increasing the vapor pressure in the low melting point feeding instrument, is finally dissolved in the molten silicon liquid S to decrease the vapor pressure inside the feeding instrument due to the phenomenon of dissolution, which is a spontaneous reaction in thermodynamics. Thus, 100% of the low melting point dopant is doped in the molten silicon liquid, making it possible to control the concentration of the dopant in the silicon melt S quantitatively.

Since low melting point dopant D used for doping material is commonly metallurgical grade, oxides are generated due to impurities existing in the metallurgical dopant of low degree of purity in the course of the doping process; the oxides float on the surface of the molten silicon liquid. The oxide particles O, as shown in FIG. 1D, float only on the restricted area within the low melting point dopant feeding instrument 100. Moreover, when the low melting point dopant feeding instrument 100 is separated from the surface of the molten silicon liquid S after the low melting point dopant D has been fully dissolved in the molten silicon liquid, the oxide particles O adhere to the sidewall portion 102 of the low melting point dopant feeding instrument 100 or the net-like bottom part 103 since the adhesion of the oxides reduces the surface energy of the oxide particles O, and the oxides can be removed from the molten silicon liquid S when the feeding instrument is separated therefrom. Specifically, since the bottom 103 of the low melting point dopant feeding instrument 100 is a net-like structure with holes 103a to increase the surface area of the bottom, the oxide particles O easily adhere to the net-like bottom 103. Hence, after separation of the low melting point dopant feeding instrument 100 from the molten silicon liquid S, the oxide particles O fail to remain on the surface of the molten silicon liquid.

The melting point of the material of low melting point dopant feeding instrument 100 is lower than the temperature (about 1,450° C.) of molten silicon liquid S in the quartz crucible and should be free from corrosion while the low melting point dopant doping process is carried out. Hence, the low melting point dopant feeding instrument 100 is preferably made of high purity fused quartz glass.

Figure 1C:
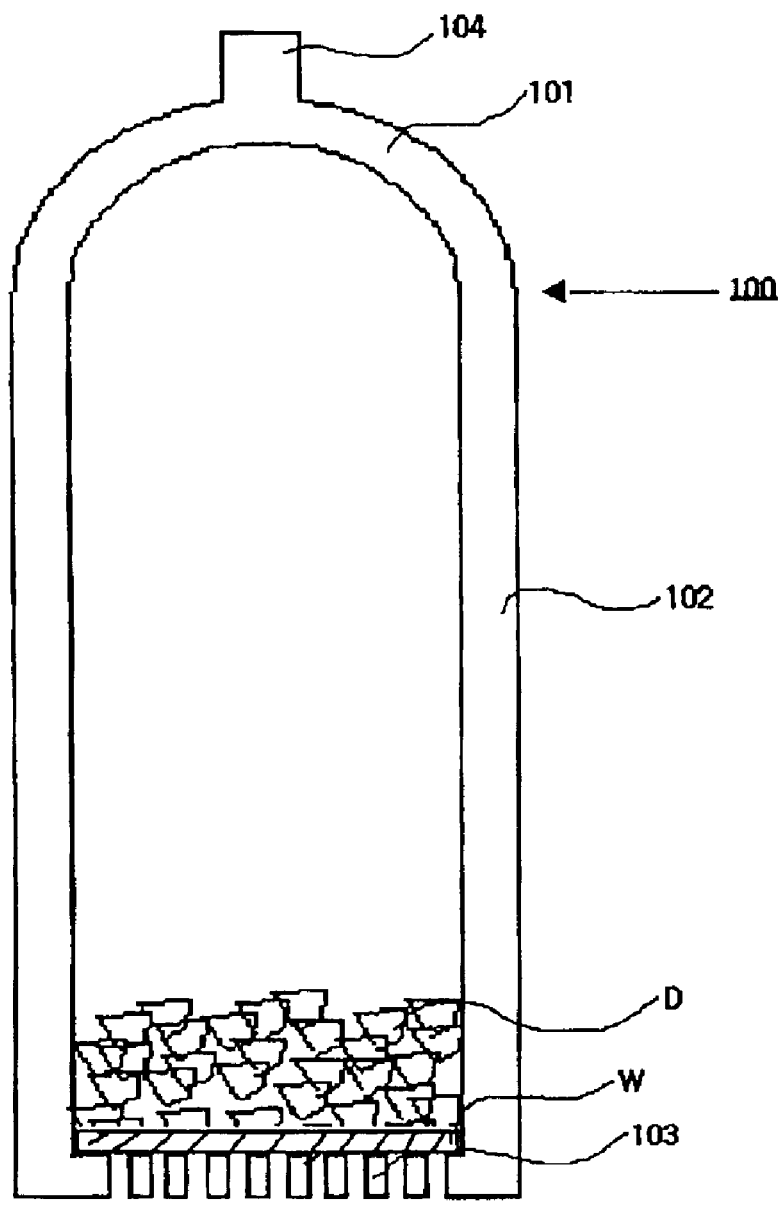
FIG. 1C is a cross-sectional view of a low melting point dopant feeding instrument with a silicon wafer inserted therein according to the present invention.
Figure 1D:
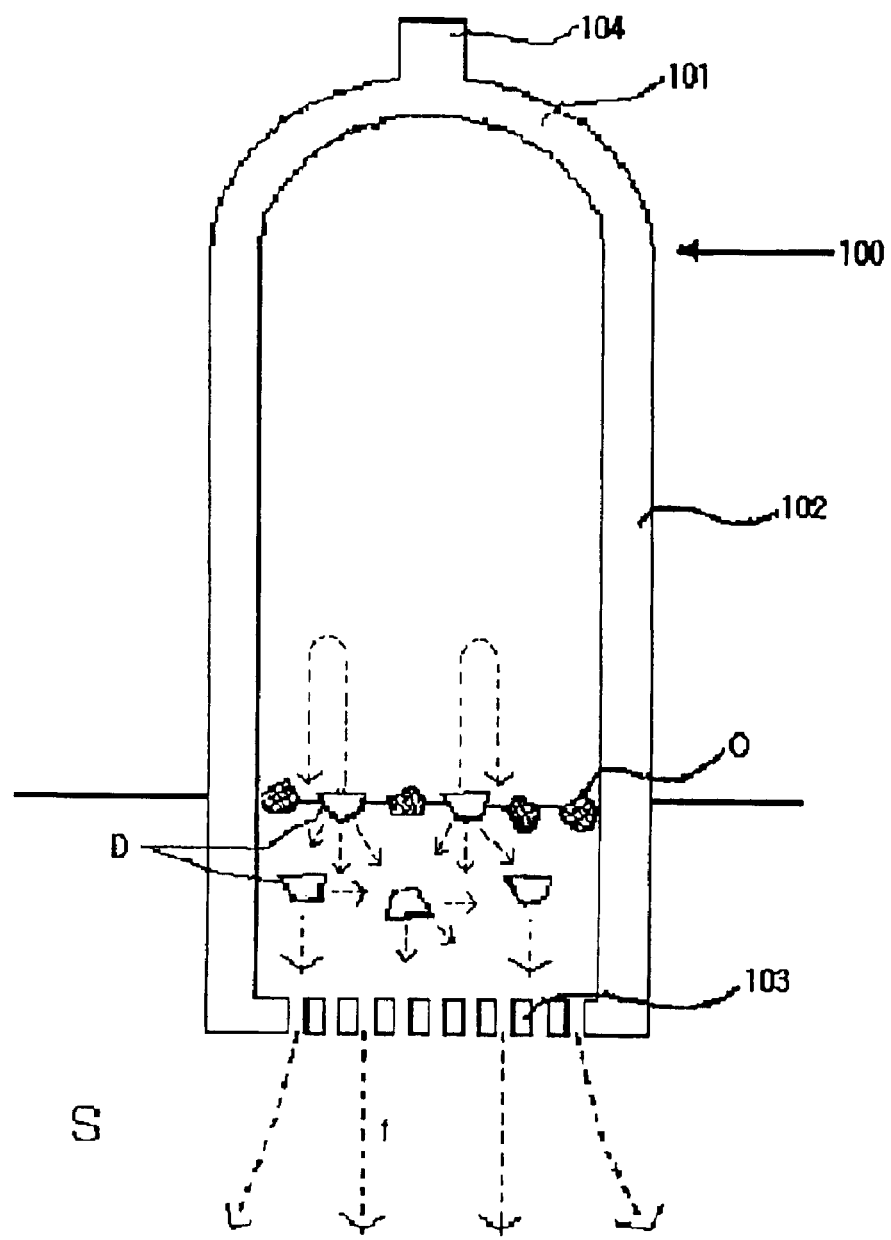
FIG. 1D illustrates the doping process of a low melting point dopant according to the present invention.

In order to prevent the low melting point dopant D from being heated and melted by the direct radiant heat from the surface of the molten silicon liquid S or the radiant heat from the heating unit 20, a silicon wafer W, as shown in FIG. 1C, is preferably inserted between the bottom 103 of the low melting point dopant feeding instrument 100 and the low melting point dopant D when the low melting point dopant D is loaded inside the low melting point dopant feeding instrument 100.

Therefore, even if the radiant heat from the surface of the molten silicon liquid S or the heating unit 20 is applied to the low melting point dopant feeding instrument 100, the silicon wafer W makes it possible to prevent the heat from being applied directly to the low melting point dopant D. Hence, the low melting point dopant D is unable to drain outside through the lower net-like bottom 103 of the feeding instrument 100. After the low melting point feeding instrument 100 has been dipped into the molten silicon liquid S, the silicon wafer W, as shown in FIG. 1D, is melted by the temperature (about 1,450° C.) of the molten silicon liquid S, and the molten silicon liquid S is doped with the low melting point dopant D inside the feeding instrument 100 through the net-like bottom 103 of the feeding instrument 100.

The low melting point dopant feeding instrument 100, as shown in FIG. 2, includes a conjunction portion 104 to be coupled with the seed chuck 41 of the crystal pulling lifter 40. The coupling portion 104 is preferably coupled with or separated from the seed chuck 41. Namely, after the low melting point dopant D has been loaded inside the low melting point dopant feeding instrument 100, the low melting point dopant feeding instrument 100 is coupled with the seed chuck 41 of the crystal pulling lifter 40 to lower the crystal pulling lifter 40. Hence, the lower portion of the low melting point dopant feeding instrument 100 can be dipped into the molten silicon liquid S. After the feeding of the low melting point dopant has been completed, the crystal pulling lifter 40 is lifted to separate the low melting point dopant feeding instrument 100 from the seed chuck 41. A seed is coupled with the seed chuck 41 to carry out the subsequent processes such as seed dipping, necking, shouldering, body growing, tailing, cooling, and crystal removal.

The present invention may further include a heat shield 50 to cut off the radiant heat which is emitted from the heating unit 20 or the surface of the molten silicon liquid S from the low melting point dopant feeding instrument 100, as shown in FIG. 2, before the dopant D inside the low melting point dopant feeding instrument 100, which has been coupled with the seed chuck 41 of the crystal pulling lifter 40, is lowered and dipped in the molten silicon liquid S inside the quartz crucible 10.

The present invention further may include a cooling device 60 to cut off the radiant heat which is emitted from the heating unit 20 or the surface of the molten silicon liquid S from the low melting point dopant feeding instrument 100, as shown in FIG. 2, before the dopant D inside the low melting point dopant feeding instrument 100, which has been coupled with the seed chuck 41 of the crystal pulling lifter 40, is lowered and dipped in the molten silicon liquid S inside the quartz crucible 10. The cooling device 60 is installed at the upper part 30 of the silicon single crystal growing furnace located a predetermined distance from the surface of the molten silicon liquid S inside the quartz crucible 10 and has a coolant circulating inside the cooling device.

The silicon single crystal growing apparatus supplemented with the low melting point dopant feeding instrument 100 preferably includes both of the heat shield 50 and the cooling device 60. By such means, it is possible to prevent the low melting point dopant D from melting or evaporating inside the low melting point dopant feeding instrument 100 when the low melting point dopant feeding instrument 100, which has been coupled with the seed chuck 41 of the crystal pulling lifter 40, is lowered, and the lower portion of the feeding instrument is dipped in the molten silicon liquid S inside the quartz crucible 10.

A low melting point dopant feeding method according to the present invention is explained in detail as follows.

In a low melting point dopant feeding method according to the present invention, as shown in FIG. 1A, a low melting point dopant D is loaded inside a low melting point dopant feeding instrument 100 having vacuum-tight-sealed sidewall 102 and upper portions 101 and a net-like bottom portion 103. The bottom portion 103 of the low melting point dopant feeding instrument 100 is dipped in a molten silicon liquid S contained inside a quartz crucible 10. The low melting point dopant D is then dissolved or evaporated by the heat of the molten silicon liquid S to dope the molten silicon liquid S with the low melting point dopant D through the holes of the net-like bottom 103 of the low melting point dopant feeding instrument 100. In this case, when the low melting point dopant D is loaded in the low melting point dopant feeding instrument 100, a silicon wafer W is preferably inserted between the low melting point dopant D and the bottom 103 of the low melting point dopant feeding instrument 100. The principle of feeding the low melting point dopant D into the molten silicon liquid S through the low melting point dopant feeding instrument 100 is the same as explained in the embodiment of the silicon single crystal growing furnace having the low melting point dopant feeding instrument 100 according to the present invention.

More preferably, in the present invention of feeding the low melting point dopant into the molten silicon liquid using the low melting point dopant feeding instrument, the low melting point dopant D is loaded inside the low melting point dopant feeding instrument 100, the low melting point dopant feeding instrument 100 is coupled with a seed chuck 41 of a crystal pulling lifter 40, the crystal pulling lifter 40 is lowered to contact the bottom of the low melting point dopant feeding instrument 100 with the molten silicon liquid S so that the low melting point dopant D is dissolved in the molten silicon liquid S, the crystal pulling lifter 40 is lifted up after the completion of doping to separate the low melting point dopant feeding instrument 100, and then a silicon seed is installed to carry out the subsequent processes of growing a silicon single crystal. Namely, in order to dope the molten silicon liquid S with the low melting point dopant D, after polysilicon loaded on the quartz crucible 10 has been melted, the low melting point dopant feeding instrument 100 is coupled with the seed chuck 41 of the crystal pulling lifter 40 before the seed dipping process.

Accordingly, the silicon single crystal growing apparatus having a low melting point dopant feeding instrument and the low melting point dopant feeding method thereof according to the present invention can prevent contamination inside the silicon single crystal growing apparatus, control the feeding concentration of the low melting point dopant, minimize the loss of the low melting point dopant, and protect against the risk of failure in growth of a silicon single crystal which is caused by oxide particles generated in the course of the doping process.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A low melting point dopant feeding method comprising the steps of:
    loading a low melting point dopant inside a low melting point dopant feeding instrument having a vacuum-tight sealed sidewall and upper portions and an open bottom portion with net-like structure having holes therein; and
    dipping the bottom portion of the low melting point dopant feeding instrument in the molten silicon liquid contained inside a quartz crucible wherein the low melting point dopant is dissolved or evaporated by the heat of the molten silicon liquid to dope the molten silicon liquid with the evaporated low melting point dopant through the holes in the bottom portion of the low melting point dopant feeding instrument.

2. The method of claim 1, wherein a silicon wafer is inserted between the bottom portion of the low melting point dopant feeding instrument and the low melting point dopant when the low melting point dopant is loaded inside the low melting point dopant feeding instrument.

3. The method of claim 1, after the step of loading the low melting point dopant inside the low melting point dopant feeding instrument, further comprising the steps of:
    coupling the low melting point dopant feeding instrument with a seed chuck of a crystal pulling lifter;
    lowering the crystal pulling lifter to dip the open bottom portion of the low melting point dopant feeding instrument in the molten silicon liquid so that the molten silicon liquid is doped with the low melting point dopant; and
    lifting the crystal pulling lifter to separate the low melting point dopant feeding instrument after the molten silicon liquid is doped with the low melting point dopant.

4. A silicon single crystal growing apparatus, comprising:
    a quartz crucible for containing molten silicon liquid;
    a heating unit supplying the quartz crucible with a radiant heat;
    a crystal pulling lifter pulling up a silicon single crystal from a molten silicon liquid in the quartz crucible; and
    a low melting point dopant feeding instrument, the low melting point dopant feeding instrument comprising:
    a sidewall portion;
    an upper portion; and
    an open bottom portion with net-like structure, wherein the sidewall and upper portions are vacuum-tight sealed and wherein a low melting point dopant is loaded inside the low melting point dopant feeding instrument.

5. The silicon single crystal growing apparatus of claim 1, wherein the low melting point dopant feeding instrument is made of a high-purity fused quartz glass.

6. The silicon single crystal growing apparatus of claim 1, wherein a silicon wafer is inserted between the bottom portion of the low melting point dopant feeding instrument and the low melting point dopant when the low melting point dopant is loaded inside the low melting point dopant feeding instrument.

7. The silicon single crystal growing apparatus of claim 1, the low melting point dopant feeding instrument further comprising a coupling portion coupled with a seed chuck of the crystal pulling lifter wherein the coupling portion of the low melting point dopant feeding instrument is coupled with or separated from the seed chuck.

8. The silicon single crystal growing apparatus of claim 7, further comprising a heat shield to cut off a radiant heat which is emitted from the heating unit or the molten silicon liquid from reaching the low melting point dopant feeding instrument when the dopant inside the low melting point dopant feeding instrument is dipped in the molten silicon liquid inside the quartz crucible while the crystal pulling lifter is lowered.

9. The silicon single crystal growing apparatus of claim 7, further comprising a cooling device cutting off the radiant heat which is emitted from the heating unit or the surface of the molten silicon liquid from reaching the low melting point dopant feeding instrument when the dopant D inside the low melting point dopant feeding instrument is dipped in the melted silicon inside the quartz crucible while the crystal pulling lifter is lowered, the cooling device having a coolant circulating inside installed at an upper part of the silicon single crystal growing apparatus to leave a distance from an upper surface of the molten silicon liquid inside the quartz crucible.

* * * * *